(12) United States Patent
Magro et al.

(10) Patent No.: US 10,037,150 B2
(45) Date of Patent: Jul. 31, 2018

(54) MEMORY CONTROLLER WITH VIRTUAL CONTROLLER MODE

(71) Applicant: Advanced Micro Devices, Inc., Sunnyvale, CA (US)

(72) Inventors: James R. Magro, Austin, TX (US); Kedarnath Balakrishnan, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 155 days.

(21) Appl. No.: 15/252,889

(22) Filed: Aug. 31, 2016

(65) Prior Publication Data
US 2018/0018105 A1    Jan. 18, 2018

Related U.S. Application Data

(60) Provisional application No. 62/363,008, filed on Jul. 15, 2016, provisional application No. 62/377,265, filed on Aug. 19, 2016.

(51) Int. Cl.
*G06F 12/00* (2006.01)
*G06F 3/06* (2006.01)
(Continued)

(52) U.S. Cl.
CPC .......... *G06F 3/0611* (2013.01); *G06F 3/0659* (2013.01); *G06F 3/0674* (2013.01);
(Continued)

(58) Field of Classification Search
None
See application file for complete search history.

(56) References Cited

U.S. PATENT DOCUMENTS 6,260,081 B1   7/2001  Magro et al.
6,496,906 B1   12/2002 Novak et al.
(Continued)

FOREIGN PATENT DOCUMENTS

EP    2431884 A1    3/2012
WO    2006134746 A1    12/2006
WO    2010013189 A2    2/2010

OTHER PUBLICATIONS

Search Report in European Patent Application No. EP16200975, dated May 19, 2017, 4 pages.
(Continued)

*Primary Examiner* — John A Lane
(74) *Attorney, Agent, or Firm* — Polansky & Associates, P.L.L.C.; Paul J. Polansky

(57) ABSTRACT

In one form, a memory controller has a memory channel controller including a command queue and an arbiter. The command queue stores memory access requests including a sub-channel number in a virtual controller mode. The arbiter is coupled to the command queue to select memory access commands from the command queue according to predetermined criteria. In the virtual controller mode, the arbiter selects from among the memory access requests in each sub-channel independently using the predetermined criteria, and sends selected memory access requests to a corresponding one of a plurality of sub-channels. In another form, a data processing system includes a plurality of memory channels and such a memory controller coupled to the plurality of sub-channels.

25 Claims, 5 Drawing Sheets

(51) Int. Cl.
  *G11C 7/10*    (2006.01)
  *G06F 13/28*   (2006.01)
  *G06F 13/40*   (2006.01)

(52) U.S. Cl.
  CPC ........ *G06F 13/287* (2013.01); *G06F 13/4022* (2013.01); *G11C 7/1072* (2013.01)

(56) References Cited

U.S. PATENT DOCUMENTS

| | | |
|---|---|---|
| 2006/0294264 A1 | 12/2006 | Akiyama et al. |
| 2007/0156946 A1 | 7/2007 | Lakshmanamurthy et al. |
| 2009/0327596 A1 | 12/2009 | Christenson et al. |
| 2010/0153661 A1 | 6/2010 | Vamanan et al. |
| 2011/0238941 A1 | 9/2011 | Xu et al. |
| 2014/0258620 A1 | 9/2014 | Nagarajan et al. |
| 2015/0221358 A1 | 8/2015 | Brandl |
| 2017/0083372 A1* | 3/2017 | Lin .................... G06F 3/061 |
| 2017/0336989 A1* | 11/2017 | Zawodny ................ G11C 7/10 |
| 2018/0018291 A1* | 1/2018 | Magro ............... G06F 13/4068 |

OTHER PUBLICATIONS

International Search Report and Written Opinion for International Application No. PCT/US2016/053455, dated Apr. 14, 2017, 9 pages.

* cited by examiner

MEMORY CONTROLLER WITH VIRTUAL CONTROLLER MODE

This application claims priority to U.S. Provisional Application No. 62/363,008, filed on Jul. 15, 2016, entitled "MEMORY CONTROLLER WITH VIRTUAL CONTROLLER MODE," invented by James R. Magro and Kedarnath Balakrishnan, and U.S. Provisional Application No. 62/377,265, filed on Aug. 19, 2016, entitled "MEMORY CONTROLLER WITH VIRTUAL CONTROLLER MODE," invented by James R. Magro and Kedarnath Balakrishnan.

BACKGROUND

Computer systems typically use inexpensive and high-density dynamic random access memory (DRAM) chips for main memory. Most DRAM chips sold today are compatible with various double data rate (DDR) DRAM standards promulgated by the Joint Electron Devices Engineering Council (JEDEC). DDR DRAMs offer both high performance and low power operation by providing various low power modes.

Modern DDR memory controllers maintain queues to store pending memory access requests to allow them to pick the pending memory access requests out of order in relation to the order in which they were generated or stored to increase efficiency. For example, the memory controllers can retrieve multiple memory access requests to the same row in a given rank of memory from the queue and issue them consecutively to the memory system to avoid the overhead of precharging the current row and activating another row. Memory controllers also need to be flexible enough so they can be configured for different memory types, densities, and memory channel topologies, but to do so without requiring a large amount of additional circuit area that would add to chip cost to support these different modes.

Figure 1:
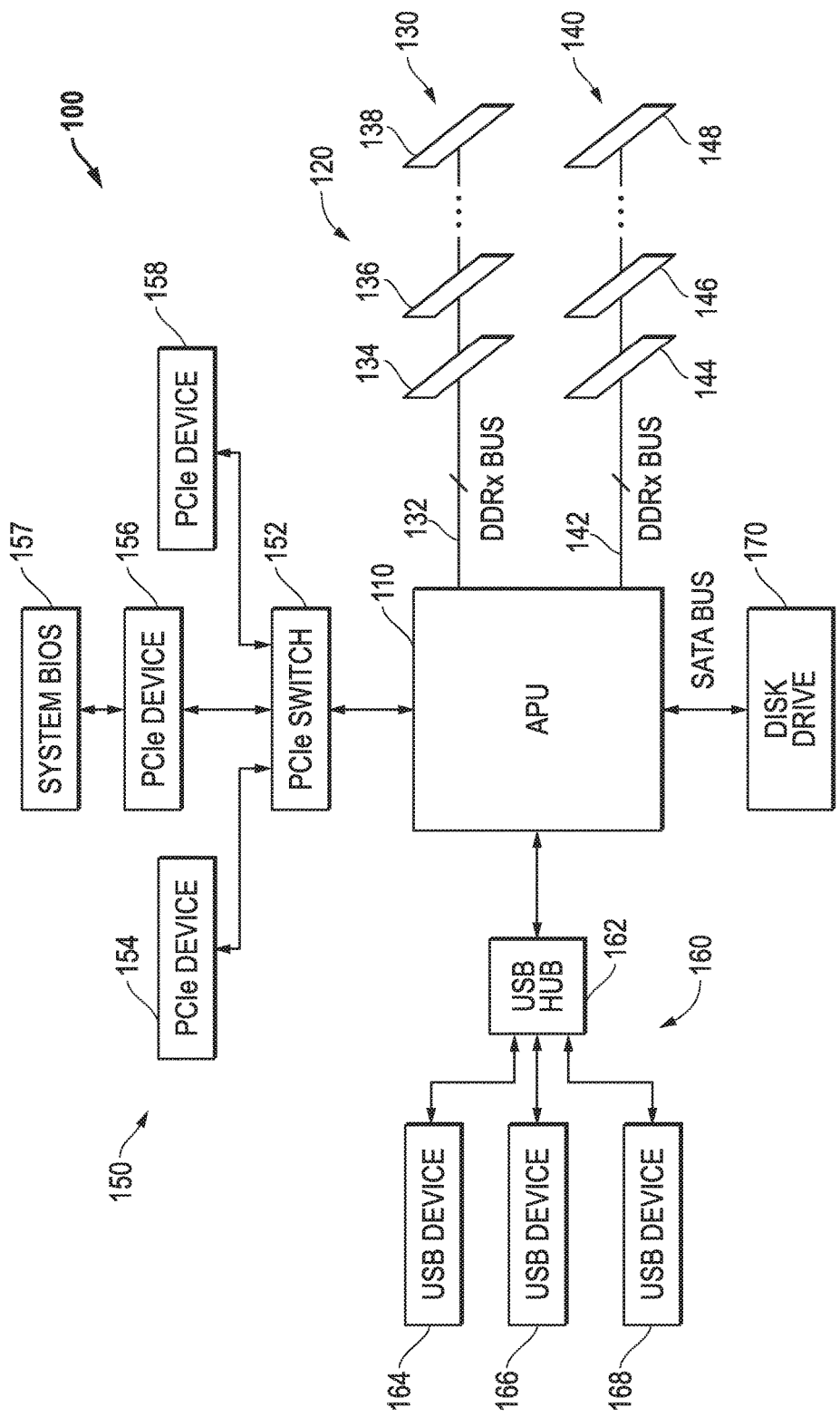
FIG. 1 illustrates in block diagram form a data processing system according to some embodiments.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

As will be described below in one form, a memory controller includes a memory channel controller including a command queue and an arbiter. The command queue stores memory access requests including a sub-channel number in a virtual controller mode. The arbiter is coupled to the command queue to select memory access commands from the command queue according to predetermined criteria, wherein in the virtual controller mode the arbiter selects from among the memory access requests in each sub-channel independently using the predetermined criteria, and sends selected memory access requests to a corresponding one of a plurality of sub-channels. In this way, one memory channel controller can access multiple channels and the size of the memory controller can be reduced.

In another form, a memory controller has a memory channel controller with the virtual controller mode. The memory channel controller includes an address generator, a command queue, an arbiter, and a dispatch queue. The address generator receives memory access requests and decodes the memory access requests to select a rank and bank of memory devices in a memory system, and in the virtual controller mode further decodes a sub-channel number of a plurality of sub-channels for each of the memory access requests. The command queue is coupled to the address generator for storing the memory access requests so decoded, including the sub-channel number in the virtual controller mode. The arbiter is coupled to the command queue to select memory access requests from the command queue using the rank and the bank according to predetermined criteria, and in the virtual controller mode selecting from among the memory access requests in each sub-channel independently using the predetermined criteria. The dispatch queue is coupled to the command queue for dispatching selected memory commands to a memory system over a physical interface, and in the virtual controller mode further dispatching the selected memory commands to a selected sub-channel.

In yet another form, a data processing system includes a plurality of memory channels and a memory controller coupled to the plurality of memory channels. The memory controller has a memory channel controller with a virtual controller mode. The memory channel controller includes a command queue and an arbiter. The command queue is for storing memory access requests including a sub-channel number in the virtual controller mode. The arbiter is coupled to the command queue to select memory access commands from the command queue according to predetermined criteria. In the virtual controller mode the arbiter selects from among the memory access requests in each sub-channel independently using the predetermined criteria, and sends selected memory access requests to a one of the plurality of memory channels corresponding to the sub-channel number.

In yet another form, a method is for controlling a memory system having a plurality of memory channels. In a virtual controller mode, memory access requests are received and each of the memory access requests is decoded into a bank, a rank, and a sub-channel of memory devices in the memory system. The memory access requests including the bank, the rank, and the sub-channel are stored in a command queue. Predetermined criteria are used to select from among a plurality of memory access requests in the command queue using predetermined criteria, and the predetermined criteria are further used to independently select from among the memory access requests to each sub-channel. The memory access requests, so selected, are dispatched to one of the plurality of memory channels according to the sub-channel.

FIG. 1 illustrates in block diagram form a data processing system 100 according to some embodiments. Data processing system 100 includes generally a data processor 110 in the form of an accelerated processing unit (APU), a memory system 120, a peripheral component interconnect express (PCIe) system 150, a universal serial bus (USB) system 160, and a disk drive 170. Data processor 110 operates as the central processing unit (CPU) of data processing system 100 and provides various buses and interfaces useful in modern computer systems. These interfaces include two double data rate (DDRx) memory channels, a PCIe root complex for connection to a PCIe link, a USB controller for connection to a USB network, and an interface to a Serial Advanced Technology Attachment (SATA) mass storage device.

Memory system 120 includes a memory channel 130 and a memory channel 140. Memory channel 130 includes a set of dual inline memory modules (DIMMs) connected to a DDRx bus 132, including representative DIMMs 134, 136, and 138 that in this example correspond to separate ranks. Likewise memory channel 140 includes a set of DIMMs connected to a DDRx bus 142, including representative DIMMs 144, 146, and 148.

PCIe system 150 includes a PCIe switch 152 connected to the PCIe root complex in data processor 110, a PCIe device 154, a PCIe device 156, and a PCIe device 158. PCIe device 156 in turn is connected to a system basic input/output system (BIOS) memory 157. System BIOS memory 157 can be any of a variety of non-volatile memory types, such as read-only memory (ROM), flash electrically erasable programmable ROM (EEPROM), and the like.

USB system 160 includes a USB hub 162 connected to a USB master in data processor 110, and representative USB devices 164, 166, and 168 each connected to USB hub 162. USB devices 164, 166, and 168 could be devices such as a keyboard, a mouse, a flash EEPROM port, and the like.

Disk drive 170 is connected to data processor 110 over a SATA bus and provides mass storage for the operating system, application programs, application files, and the like.

Data processing system 100 is suitable for use in modern computing applications by providing a memory channel 130 and a memory channel 140. Each of memory channels 130 and 140 can connect to state-of-the-art DDR memories such as DDR version four (DDR4), low power DDR4 (LPDDR4), graphics DDR version five (gDDR5), and high bandwidth memory (HBM), and can be adapted for future memory technologies. These memories provide high bus bandwidth and high speed operation. At the same time, they also provide low power modes to save power for battery-powered applications such as laptop computers, and also provide built-in thermal monitoring.

Figure 2:
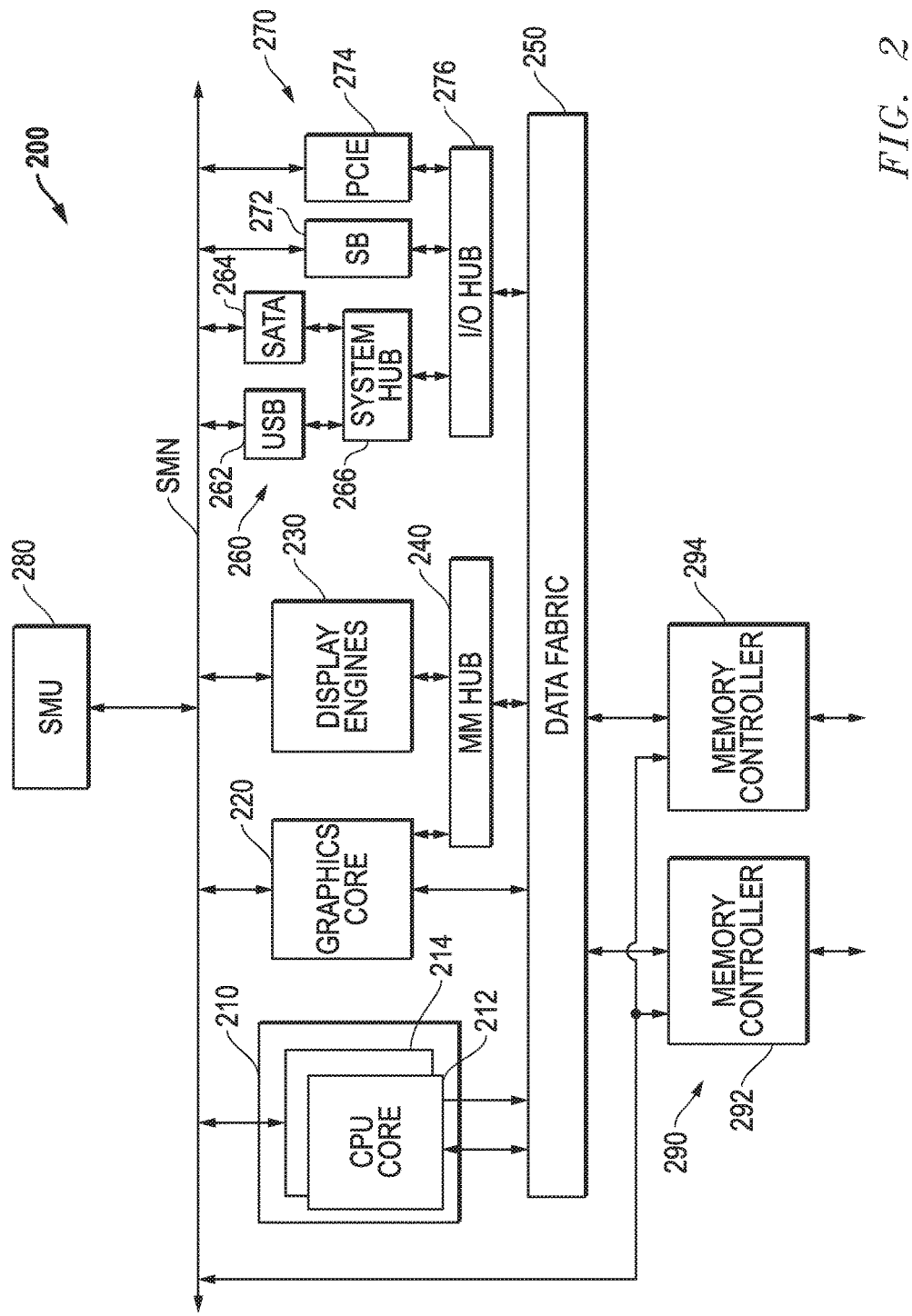
FIG. 2 illustrates in block diagram form an accelerated processing unit (APU) suitable for use in the data processing system of FIG. 1.

FIG. 2 illustrates in block diagram form an APU 200 suitable for use in data processing system 100 of FIG. 1. APU 200 includes generally a central processing unit (CPU) core complex 210, a graphics core 220, a set of display engines 230, a memory management hub 240, a data fabric 250, a set of peripheral controllers 260, a set of peripheral bus controllers 270, a system management unit (SMU) 280, and a set of memory controllers 290.

CPU core complex 210 includes a CPU core 212 and a CPU core 214. In this example, CPU core complex 210 includes two CPU cores, but in other embodiments CPU core complex can include an arbitrary number of CPU cores. Each of CPU cores 212 and 214 is bidirectionally connected to a system management network (SMN), which forms a control fabric, and to data fabric 250, and is capable of providing memory access requests to data fabric 250. Each of CPU cores 212 and 214 may be unitary cores, or may further be a core complex with two or more unitary cores sharing certain resources such as caches.

Graphics core 220 is a high performance graphics processing unit (GPU) capable of performing graphics operations such as vertex processing, fragment processing, shading, texture blending, and the like in a highly integrated and parallel fashion. Graphics core 220 is bidirectionally connected to the SMN and to data fabric 250, and is capable of providing memory access requests to data fabric 250. In this regard, APU 200 may either support a unified memory architecture in which CPU core complex 210 and graphics core 220 share the same memory space, or a memory architecture in which CPU core complex 210 and graphics core 220 share a portion of the memory space, while graphics core 220 also uses a private graphics memory not accessible by CPU core complex 210.

Display engines 230 render and rasterize objects generated by graphics core 220 for display on a monitor. Graphics core 220 and display engines 230 are bidirectionally connected to a common memory management hub 240 for uniform translation into appropriate addresses in memory system 120, and memory management hub 240 is bidirectionally connected to data fabric 250 for generating such memory accesses and receiving read data returned from the memory system.

Data fabric 250 includes a crossbar switch for routing memory access requests and memory responses between any memory accessing agent and memory controllers 290. It also includes a system memory map, defined by BIOS, for determining destinations of memory accesses based on the system configuration, as well as buffers for each virtual connection.

Peripheral controllers 260 include a USB controller 262 and a SATA interface controller 264, each of which is bidirectionally connected to a system hub 266 and to the SMN bus. These two controllers are merely exemplary of peripheral controllers that may be used in APU 200.

Peripheral bus controllers 270 include a system controller or "Southbridge" (SB) 272 and a PCIe controller 274, each of which is bidirectionally connected to an input/output (I/O) hub 276 and to the SMN bus. I/O hub 276 is also bidirectionally connected to system hub 266 and to data fabric 250. Thus for example a CPU core can program registers in USB controller 262, SATA interface controller 264, SB 272, or PCIe controller 274 through accesses that data fabric 250 routes through I/O hub 276.

SMU 280 is a local controller that controls the operation of the resources on APU 200 and synchronizes communication among them. SMU 280 manages power-up sequencing of the various processors on APU 200 and controls multiple off-chip devices via reset, enable and other signals. SMU 280 includes one or more clock sources not shown in FIG. 2, such as a phase locked loop (PLL), to provide clock signals for each of the components of APU 200. SMU 280 also manages power for the various processors and other functional blocks, and may receive measured power consumption values from CPU cores 212 and 214 and graphics core 220 to determine appropriate power states.

APU 200 also implements various system monitoring and power saving functions. In particular one system monitoring function is thermal monitoring. For example, if APU 200 becomes hot, then SMU 280 can reduce the frequency and voltage of CPU cores 212 and 214 and/or graphics core 220. If APU 200 becomes too hot, then it can be shut down entirely. Thermal events can also be received from external sensors by SMU 280 via the SMN bus, and SMU 280 can reduce the clock frequency and/or power supply voltage in response.

Figure 3:
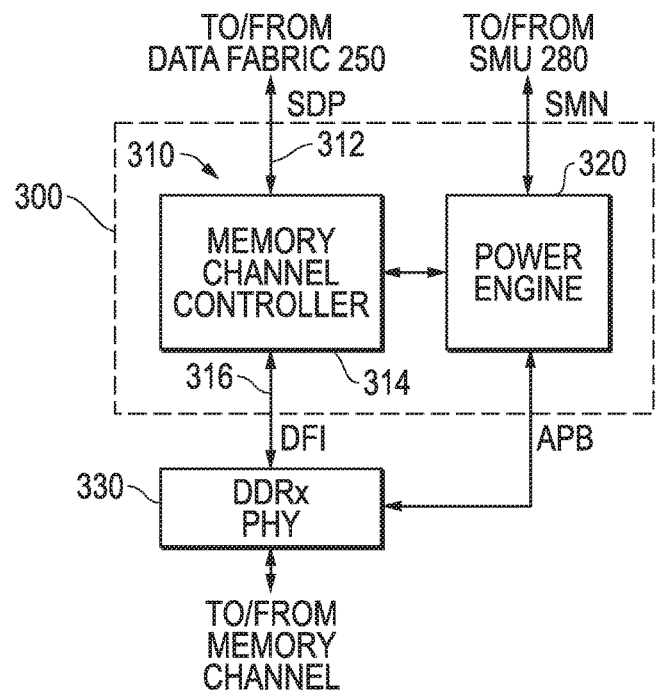
FIG. 3 illustrates in block diagram form a memory controller and associated physical interface (PHY) suitable for use in the APU of FIG. 2 according to some embodiments.

FIG. 3 illustrates in block diagram form a memory controller 300 and an associated physical interface (PHY) 330 suitable for use in APU 200 of FIG. 2 according to some embodiments. Memory controller 300 includes a memory channel 310 and a power engine 320. Memory channel 310 includes a host interface 312, a memory channel controller 314, and a physical interface 316. Host interface 312 bidirectionally connects memory channel controller 314 to data fabric 250 over a scalable data port (SDP). Physical interface 316 bidirectionally connects memory channel controller 314 to PHY 330 over a bus that conforms to the DDR-PHY Interface Specification (DFI). Power engine 320 is bidirectionally connected to SMU 280 over the SMN bus, to PHY 330 over the Advanced Peripheral Bus (APB), and is also bidirectionally connected to memory channel controller 314. PHY 330 has a bidirectional connection to a memory channel such as memory channel 130 or memory channel 140 of FIG. 1. Memory controller 300 is an instantiation of a memory controller for a single memory channel using a single memory channel controller 314, and has a power engine 320 to control operation of memory channel controller 314 in a manner that will be described further below.

Figure 4:
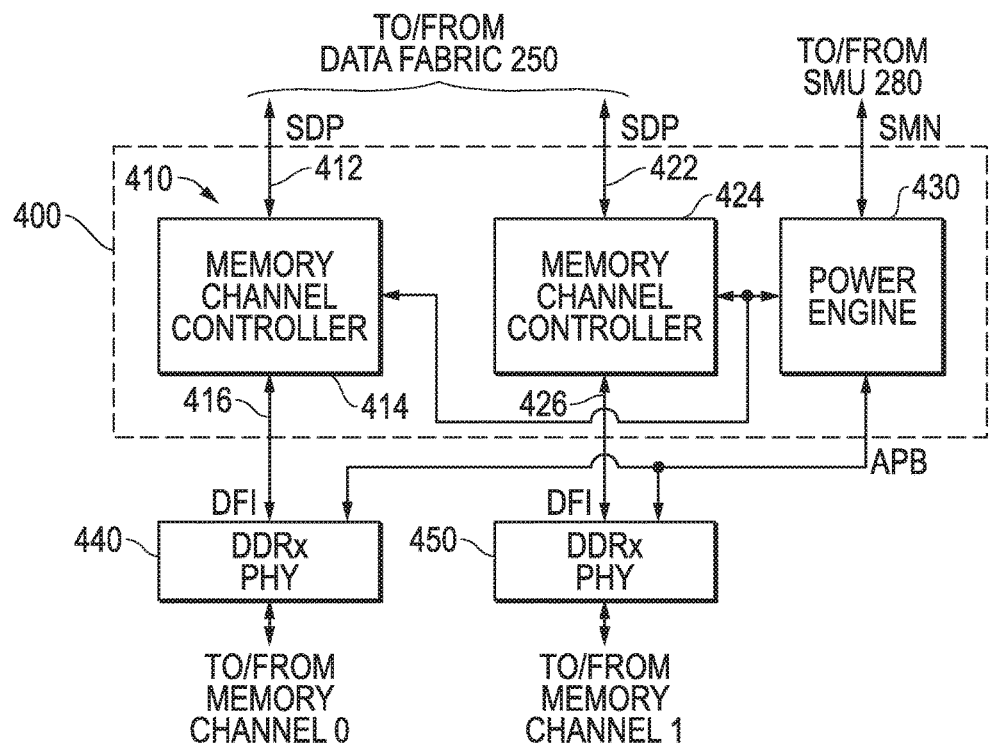
FIG. 4 illustrates in block diagram form another memory controller and associated PHY suitable for use in the APU of FIG. 2 according to some embodiments.

FIG. 4 illustrates in block diagram form another memory controller 400 and associated PHYs 440 and 450 suitable for use in APU 200 of FIG. 2 according to some embodiments. Memory controller 400 includes memory channels 410 and 420 and a power engine 430. Memory channel 410 includes a host interface 412, a memory channel controller 414, and a physical interface 416. Host interface 412 bidirectionally connects memory channel controller 414 to data fabric 250 over an SDP. Physical interface 416 bidirectionally connects memory channel controller 414 to PHY 440, and conforms to the DFI Specification. Memory channel 420 includes a host interface 422, a memory channel controller 424, and a physical interface 426. Host interface 422 bidirectionally connects memory channel controller 424 to data fabric 250 over another SDP. Physical interface 426 bidirectionally connects memory channel controller 424 to PHY 450, and conforms to the DFI Specification. Power engine 430 is bidirectionally connected to SMU 280 over the SMN bus, to PHYs 440 and 450 over the APB, and is also bidirectionally connected to memory channel controllers 414 and 424. PHY 440 has a bidirectional connection to a memory channel such as memory channel 130 of FIG. 1. PHY 450 has a bidirectional connection to a memory channel such as memory channel 140 of FIG. 1. Memory controller 400 is an instantiation of a memory controller having two memory channel controllers and uses a shared power engine 430 to control operation of both memory channel controller 414 and memory channel controller 424 in a manner that will be described further below.

Figure 5:
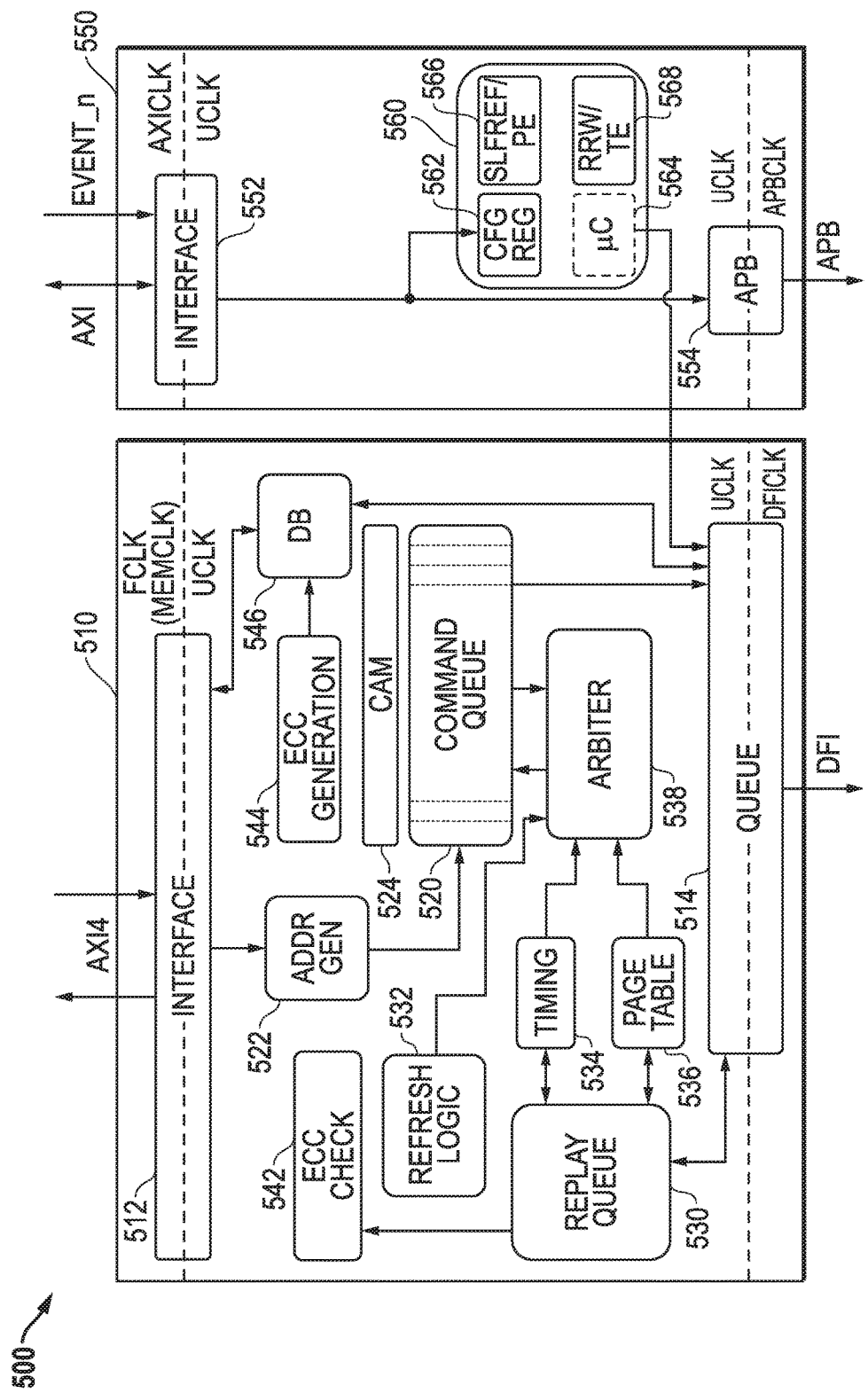
FIG. 5 illustrates in block diagram form a memory controller according to some embodiments.

FIG. 5 illustrates in block diagram form a memory controller 500 according to some embodiments. Memory controller 500 includes generally a memory channel controller 510 and a power controller 550. Memory channel controller 510 includes generally an interface 512, a queue 514, a command queue 520, an address generator 522, a content addressable memory (CAM) 524, a replay queue 530, a refresh logic block 532, a timing block 534, a page table 536, an arbiter 538, an error correction code (ECC) check block 542, an ECC generation block 544, and a data buffer (DB) 546.

Interface 512 has a first bidirectional connection to data fabric 250 over an external bus, and has an output. In memory controller 500, this external bus is compatible with the advanced extensible interface version four specified by ARM Holdings, PLC of Cambridge, England, known as "AXI4", but can be other types of interfaces in other embodiments. Interface 512 translates memory access requests from a first clock domain known as the FCLK (or MEMCLK) domain to a second clock domain internal to memory controller 500 known as the UCLK domain. Similarly, queue 514 provides memory accesses from the UCLK domain to the DFICLK domain associated with the DFI interface.

Address generator 522 decodes addresses of memory access requests received from data fabric 250 over the AXI4 bus. The memory access requests include access addresses in the physical address space represented in a normalized format. Address generator 522 converts the normalized addresses into a format that can be used to address the actual memory devices in memory system 120, as well as to efficiently schedule related accesses. This format includes a region identifier that associates the memory access request with a particular rank, a row address, a column address, a bank address, and a bank group. On startup, the system BIOS queries the memory devices in memory system 120 to determine their size and configuration, and programs a set of configuration registers associated with address generator 522. Address generator 522 uses the configuration stored in the configuration registers to translate the normalized addresses into the appropriate format. Command queue 520 is a queue of memory access requests received from the memory accessing agents in data processing system 100, such as CPU cores 212 and 214 and graphics core 220. Command queue 520 stores the address fields decoded by address generator 522 as well other address information that allows arbiter 538 to select memory accesses efficiently, including access type and quality of service (QoS) identifiers. CAM 524 includes information to enforce ordering rules, such as write after write (WAW) and read after write (RAW) ordering rules.

Replay queue 530 is a temporary queue for storing memory accesses picked by arbiter 538 that are awaiting responses, such as address and command parity responses, write cyclic redundancy check (CRC) responses for DDR4 DRAM or write and read CRC responses for GDDR5 DRAM. Replay queue 530 accesses ECC check block 542 to determine whether the returned ECC is correct or indicates an error. Replay queue 530 allows the accesses to be replayed in the case of a parity or CRC error of one of these cycles.

Refresh logic 532 includes state machines for various powerdown, refresh, and termination resistance (ZQ) calibration cycles that are generated separately from normal read and write memory access requests received from memory accessing agents. For example, if a memory rank is in precharge powerdown, it must be periodically awakened to run refresh cycles. Refresh logic 532 generates refresh commands periodically to prevent data errors caused by leaking of charge off storage capacitors of memory cells in DRAM chips. In addition, refresh logic 532 periodically calibrates ZQ to prevent mismatch in on-die termination resistance due to thermal changes in the system. Refresh logic 532 also decides when to put DRAM devices in different power down modes.

Arbiter 538 is bidirectionally connected to command queue 520 and is the heart of memory channel controller 510. It improves efficiency by intelligent scheduling of accesses to improve the usage of the memory bus. Arbiter 538 uses timing block 534 to enforce proper timing relationships by determining whether certain accesses in command queue 520 are eligible for issuance based on DRAM timing parameters. For example, each DRAM has a minimum specified time between activate commands to the same bank, known as "$t_{RC}$". Timing block 534 maintains a set of counters that determine eligibility based on this and other timing parameters specified in the JEDEC specification, and is bidirectionally connected to replay queue 530. Page table 536 maintains state information about active pages in each bank and rank of the memory channel for arbiter 538, and is bidirectionally connected to replay queue 530.

In response to write memory access requests received from interface 512, ECC generation block 544 computes an ECC according to the write data. DB 546 stores the write data and ECC for received memory access requests. It outputs the combined write data/ECC to queue 514 when arbiter 538 picks the corresponding write access for dispatch to the memory channel.

Power controller 550 generally includes an interface 552 to an advanced extensible interface, version one (AXI), an APB interface 554, and a power engine 560. Interface 552 has a first bidirectional connection to the SMN, which includes an input for receiving an event signal labeled "EVENT_n" shown separately in FIG. 5, and an output. APB interface 554 has an input connected to the output of interface 552, and an output for connection to a PHY over an APB. Power engine 560 has an input connected to the output of interface 552, and an output connected to an input of queue 514. Power engine 560 includes a set of configuration registers 562, a microcontroller (μC) 564, a self refresh controller (SLFREF/PE) 566, and a reliable read/write training engine (RRW/TE) 568. Configuration registers 562 are programmed over the AXI bus, and store configuration information to control the operation of various blocks in memory controller 500. Accordingly, configuration registers 562 have outputs connected to these blocks that are not shown in detail in FIG. 5. Self refresh controller 566 is an engine that allows the manual generation of refreshes in addition to the automatic generation of refreshes by refresh logic 532. Reliable read/write training engine 568 provides a continuous memory access stream to memory or I/O devices for such purposes as DDR interface read latency training and loopback testing.

Memory channel controller 510 includes circuitry that allows it to pick memory accesses for dispatch to the associated memory channel. In order to make the desired arbitration decisions, address generator 522 decodes the address information into predecoded information including rank, row address, column address, bank address, and bank group in the memory system, and command queue 520 stores the predecoded information. Configuration registers 562 store configuration information to determine how address generator 522 decodes the received address information. Arbiter 538 uses the decoded address information, timing eligibility information indicated by timing block 534, and active page information indicated by page table 536 to efficiently schedule memory accesses while observing other criteria such as QoS requirements. For example, arbiter 538 implements a preference for accesses to open pages to avoid the overhead of precharge and activation commands required to change memory pages, and hides overhead accesses to one bank by interleaving them with read and write accesses to another bank. In particular during normal operation, arbiter 538 may decide to keep pages open in different banks until they are required to be precharged prior to selecting a different page.

Figure 6:
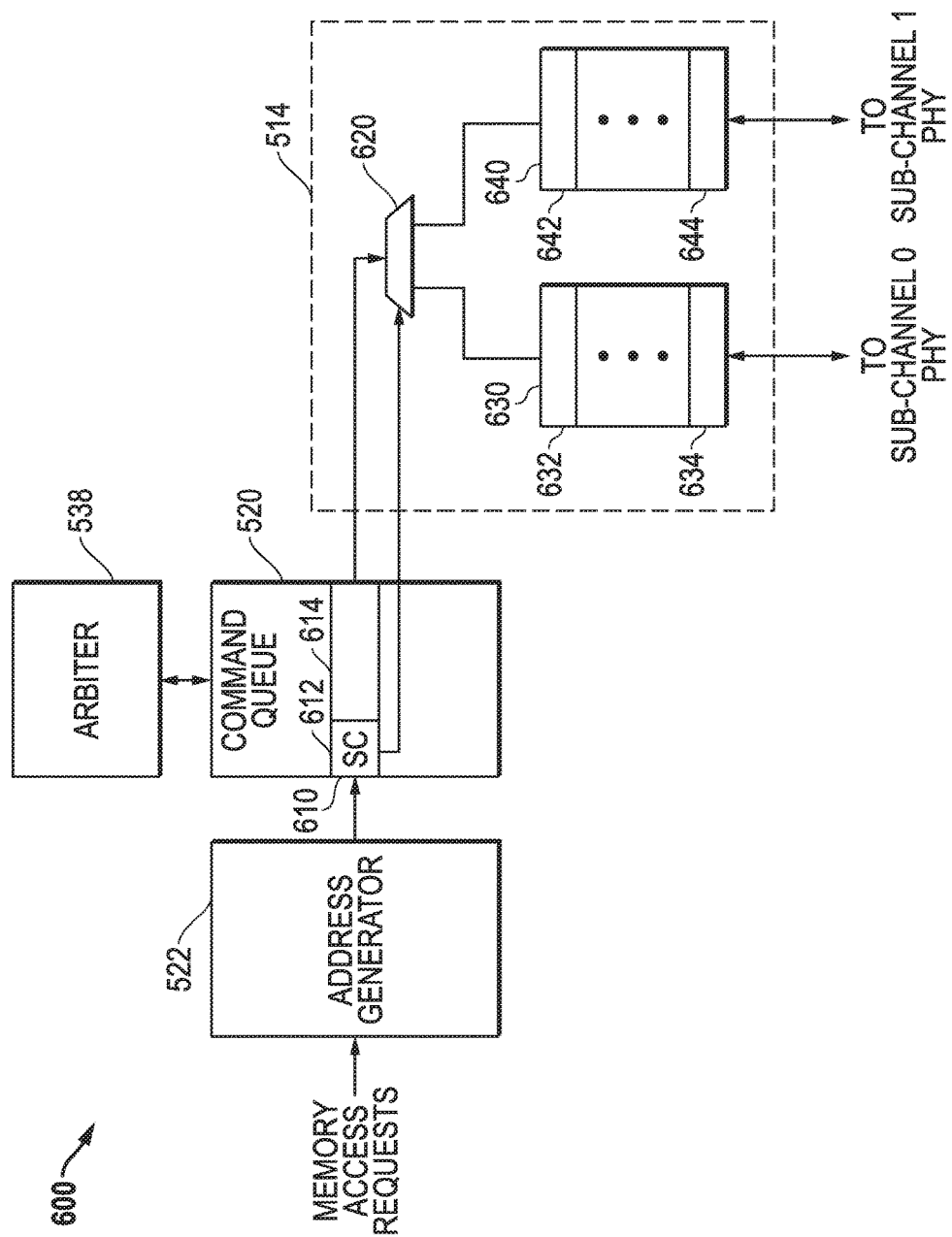
FIG. 6 illustrates in block diagram form a memory channel controller with a virtual controller mode according to some embodiments.

FIG. 6 illustrates in block diagram form a memory channel controller 600 with a virtual controller mode according to some embodiments. Memory channel controller 600 can be used as memory channel controller 510 of FIG. 6 shows additional details of queue 514, command queue 520, address generator 522, and arbiter 538 related to the virtual controller mode. As described above, address generator 522 receives memory access requests from the various memory accessing engines over data fabric 250. However when operating in the virtual controller mode, address generator 522 further decodes the address of each memory access request into a sub-channel number labeled "SC" according to the programmable decoding set by configuration registers 562 of FIG. 5.

Address generator 522 sends the decoded memory access request including the decoded sub-channel number to command queue 520. Command queue 520 stores the decoded memory access request in an entry 610 in command queue 520, which has a first field 612 for storing the decoded sub-channel number, and a second field 614 for storing the remainder of the decoded memory access request as described above.

Arbiter 538 is bidirectionally connected to command queue 520 and uses timing block 534 (not shown in FIG. 6) to enforce proper timing relationships by determining whether certain accesses in command queue 520 are eligible for issuance based on DRAM timing parameters. Arbiter 538 picks eligible memory access requests independently for each sub-channel from command queue 520 according to the predetermined criteria that it uses when virtual controller mode is not selected. Examples of these predetermined criteria are described above and may vary between embodiments.

According to one aspect of the disclosed embodiment, memory channel controller 600 assumes that each sub-channel uses the same type of memory, and leverages this assumption to form a memory channel controller with a simplified design and smaller size by using only one set of configuration registers for both sub-channels. For example, each DRAM has a minimum specified time between an activate command (or row command) and a column command, known as "$t_{RCD}$". Arbiter 538 uses counters in timing block 534 to determine eligibility of each sub-channel based on the same programmable value, and thus configuration registers 562 require only a single set of configuration registers for both sub-channels.

At some point, these criteria will cause arbiter 538 to pick the memory access request stored in entry 610 and provide it to queue 514. Queue 514 is a dispatch queue at the back end of memory channel controller 600 that sends memory access requests to a corresponding PHY while specifying the sub-channel, rank, and bank. As shown in FIG, 6, queue 514 selects between the two sub-channels and includes a selector 620 and two similar sub-channel queues 630 and 640. Selector 620 has one input and two outputs and selects between the two outputs based on the SC bit 612 provided by command queue 520 along with the memory access request 614. Queue 630 has an input connected to the first output of selector 620, a bidirectional port for connection to a PHY of sub-channel 0, and a set of entries including a first entry 632 and a last entry 634, each of which stores the decoded memory access request but not the SC. Similarly queue 640 has an input connected to the second output of selector 620, a bidirectional port for connection to a PHY of sub-channel 1, and a set of entries including a first entry 642 and a last entry 644, each of which stores the decoded memory access request but not the SC. In other embodiments, the virtual controller mode can support more than two sub-channels according to this pattern.

Virtual controller mode leverages the capabilities of memory device types that require multiple clocks per command, such as LPDDR4 and HBM. Thus arbiter 538 does not need to issue two commands simultaneously and can stagger the issuance of commands between the individual sub-channels. This staggering of the issuance of commands to different sub-channels avoids the need to gather data for two commands at the same time and to interleave the data on various internal buses. In addition, virtual controller mode is able to get the benefit of sub-channel support for LPDDR4 DRAMs and Pseudo Channel Mode of HBM DRAMs. In an exemplary embodiment, memory channel controller 600 is designed with internal buses that are wide enough to support high bandwidth modes, such as for HBM legacy mode. With these wide internal buses, memory channel controller 600 can support data transfers on multiple sub-channels simultaneously without any perceived bandwidth loss.

Memory access controller 600 is able to decode accesses for multiple sub-channels using little extra circuitry beyond that required for a memory channel controller that has a single corresponding memory channel. As shown in the example of FIG. 6, memory channel controller 600 includes an address generator 522 that further decodes the sub-channel, a command queue that stores an extra bit (SC) to keep track of the sub-channel selected by each memory access request, an arbiter that includes only a small amount of additional decoding, a timing generator and a page table (not shown in FIG. 6) that include extra circuitry to keep track of the timing eligibility and state of the additional sub-channel, and a queue that includes a selector and separate queue structures to independently queue accesses to each sub-channel. However these modifications require only a relatively small proportion of the circuit area of memory channel controller 510 and thus memory channel controller 600 is more space efficient than the two-memory channel controller design shown in FIG. 4.

Memory controller 500 of FIG. 5 and memory access controller 600 of FIG. 6 may be implemented with various combinations of hardware and software. This hardware circuitry may include priority encoders, finite state machines, programmable logic arrays (PLAs), and the like. In some embodiments, other functional blocks can be performed by a data processor under the control of software. Some of the software components may be stored in a computer readable storage medium for execution by at least one processor, and may correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Memory controller 500 of FIG. 5 or memory access controller 600 of FIG. 6 or any portions thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist includes a set of gates that also represent the functionality of the hardware comprising integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, memory controller 500 may interface to other types of memory besides DDRx memory, such as high bandwidth memory (HBM), RAMbus DRAM (RDRAM), and the like as well as different types of DIMMs. While the illustrated embodiment described memory addressing and control signals useful in DDR memory, they will vary depending on the type of memory used. Moreover memory access controller 600 of FIG. 6 can be scaled to more than two virtual channels.

Accordingly, it is intended by the appended claims to cover all modifications of the disclosed embodiments that fall within the scope of the disclosed embodiments.

What is claimed is:

1. A memory controller having a memory channel controller, the memory channel controller comprising:
   a command queue for storing memory access requests including a sub-channel number in a virtual controller mode; and
   an arbiter coupled to said command queue to select memory access commands from said command queue according to predetermined criteria, wherein in said virtual controller mode said arbiter selects from among said memory access requests in each sub-channel independently using said predetermined criteria, and sends selected memory access requests to a corresponding one of a plurality of sub-channels.

2. The memory controller of claim 1, wherein said command queue comprises:
   a plurality of entries, each entry comprising a first field for storing said sub-channel number and a second field for storing additional data about said memory access request.

3. The memory controller of claim 1, further comprising a dispatch queue for providing memory commands to selected ones of said plurality of sub-channels.

4. The memory controller of claim 3, wherein said dispatch queue comprises:
   a plurality of entries, each entry comprising said sub-channel number and additional data about said memory access request; and
   a demultiplexer having an input coupled to a last one of said plurality of entries for receiving said additional data, a control input for receiving said sub-channel number, a first output for providing a memory command to a first sub-channel, and a second output for providing a memory command to a second sub-channel.

5. The memory controller of claim 3, wherein said arbiter determines timing eligibility using a common set of timing registers for all of said plurality of sub-channels.

6. The memory controller of claim 5, further comprising a timing block coupled to said arbiter, wherein said timing block uses said common set of timing registers to separately determine timing eligibility for accesses in said command queue.

7. The memory controller of claim 3, wherein said arbiter selectively picks multiple commands per memory controller clock cycle and provides each of said multiple commands to a different one of said plurality of sub-channels.

8. The memory controller of claim 3, wherein said predetermined criteria comprise memory access type, page state, and quality of service.

9. A memory controller having a memory channel controller with a virtual controller mode, the memory channel controller comprising:
  an address generator for receiving memory access requests and decoding said memory access requests to select a rank and bank of memory devices in a memory system, and in the virtual controller mode further decoding a sub-channel number of a plurality of sub-channels for each of said memory access requests;
  a command queue coupled to said address generator for storing said decoded memory access requests, including said sub-channel number in the virtual controller mode;
  an arbiter coupled to said command queue to select memory access requests from said command queue using said rank and said bank according to predetermined criteria, and in the virtual controller mode selecting from among said memory access requests in each sub-channel independently using said predetermined criteria; and
  a dispatch queue coupled to said command queue for dispatching selected memory commands to a memory system over a physical interface, and in the virtual controller mode further dispatching said selected memory commands to a selected sub-channel.

10. The memory controller of claim 9, wherein said command queue comprises:
  a plurality of entries, each entry comprising a first field for storing said sub-channel number and a second field for storing additional data about said memory access request.

11. The memory controller of claim 10, wherein said dispatch queue comprises:
  a plurality of entries, each entry comprising said sub-channel number and additional data about said memory access request; and
  a demultiplexer having an input coupled to a last one of said plurality of entries for receiving said additional data, a control input coupled to said sub-channel number, a first output for providing a memory command to a first sub-channel, and a second output for providing a memory command to a second sub-channel.

12. The memory controller of claim 9, wherein said arbiter determines timing eligibility using a common set of timing registers for all of said plurality of sub-channels.

13. The memory controller of claim 12, further comprising a timing block coupled to said arbiter, wherein said timing block uses said common set of timing registers to separately determine timing eligibility for accesses in said command queue.

14. The memory controller of claim 9, wherein said arbiter selectively picks multiple commands per memory controller clock cycle and provides each of said multiple commands to a different one of said plurality of sub-channels.

15. A data processing system comprising:
  a plurality of memory channels;
  a memory controller coupled to said plurality of memory channels and having a memory channel controller with a virtual controller mode, said memory channel controller comprising:
    a command queue for storing memory access requests including a sub-channel number in said virtual controller mode; and
    an arbiter coupled to said command queue to select memory access commands from said command queue according to predetermined criteria, wherein in said virtual controller mode said arbiter selects from among said memory access requests in each sub-channel independently using said predetermined criteria, and sends selected memory access requests to a one of said plurality of memory channels corresponding to said sub-channel number.

16. The data processing system of claim 15, wherein said command queue comprises:
  a plurality of entries, each entry comprising a first field for storing said sub-channel number and a second field additional data about said memory access request.

17. The data processing system of claim 15, further comprising a dispatch queue for providing memory commands to selected ones of said plurality of memory channels.

18. The data processing system of claim 17, wherein said dispatch queue comprises:
  a plurality of entries, each entry comprising said sub-channel number and additional data about said memory access request; and
  a demultiplexer having an input coupled to said a last one of said plurality of entries for receiving said additional data, a control input coupled to said sub-channel number, a first output for providing a memory command to a first sub-channel, and a second output for providing a memory command to a second sub-channel.

19. The data processing system of claim 17, wherein said arbiter determines timing eligibility using a common set of timing registers for all of said plurality of memory channels.

20. The data processing system of claim 19, further comprising a timing block coupled to said arbiter, wherein said timing block uses said common set of timing registers to separately determine timing eligibility for accesses in said command queue.

21. The data processing system of claim 17, wherein said arbiter selectively picks multiple commands per memory controller clock cycle and provides each of said multiple commands to a different one of said plurality of memory channels.

22. The data processing system of claim 17, further comprising a plurality of memory accessing agents for providing said memory access requests.

23. A method for controlling a memory system having a plurality of memory channels, comprising:
  in a virtual controller mode:
    receiving memory access requests;
    decoding each of said memory access requests into a bank, a rank, and a sub-channel of a plurality of sub-channels of memory devices in the memory system;
    storing said memory access request including said bank, said rank, and said sub-channel in a command queue;
    selecting from among a plurality of memory access requests in said command queue using predetermined criteria, wherein said selecting further comprises selecting from among said memory access requests to each sub-channel independently using said predetermined criteria; and dispatching said memory access requests, so selected, to one of the plurality of memory channels according to said sub-channel.

24. The method of claim 23, further comprising:

demultiplexing selected memory access requests to said plurality of memory channels based on said sub-channel.

25. The method of claim 23, further comprising:

determining timing eligibility for said memory access requests using a common set of timing registers for all of said plurality of sub-channels.

* * * * *